United States Patent
Potter et al.

(10) Patent No.: US 7,092,538 B2
(45) Date of Patent: Aug. 15, 2006

(54) SWITCHED MICROPHONE BUFFER

(75) Inventors: Robert C. Potter, Naperville, IL (US); Steven E. Boor, Plano, TX (US)

(73) Assignee: Knowles Electronics, LLC, Itasca, IL (US)

( * ) Notice: Subject to any disclaimer, the term of this patent is extended or adjusted under 35 U.S.C. 154(b) by 661 days.

(21) Appl. No.: 10/412,460

(22) Filed: Apr. 11, 2003

(65) Prior Publication Data

US 2003/0193354 A1    Oct. 16, 2003

Related U.S. Application Data

(60) Provisional application No. 60/372,451, filed on Apr. 15, 2002.

(51) Int. Cl.
*H04R 3/00* (2006.01)
(52) U.S. Cl. ............... 381/113; 381/317; 330/9; 327/124
(58) Field of Classification Search ........ 381/111–115, 381/122, 123, 94.1, 317, 312; 330/9, 277; 327/124
See application file for complete search history.

(56) References Cited

U.S. PATENT DOCUMENTS

| | | | |
|---|---|---|---|
| 3,512,100 A | 5/1970 | Killion et al. | |
| 4,151,480 A | 4/1979 | Carlson et al. | |
| 5,083,095 A | 1/1992 | Madaffari | |
| 5,097,224 A | 3/1992 | Madaffari et al. | |
| 5,589,799 A | 12/1996 | Madaffari et al. | |
| 6,353,344 B1 | 3/2002 | Lafort | |
| 2001/0011923 A1 | 8/2001 | Bakker et al. | |

FOREIGN PATENT DOCUMENTS

| EP | 0 880 225 A2 | 11/1998 |
|---|---|---|
| EP | 0 969 695 A1 | 1/2000 |
| GB | 1 219 299 | 1/1971 |

OTHER PUBLICATIONS

European Search Report for Application No. 03 25 2381 dated Mar. 15, 2004.

*Primary Examiner*—Ping Lee
(74) *Attorney, Agent, or Firm*—Marshall, Gerstein & Borun LLP

(57) ABSTRACT

A method and apparatus for substantially reducing and virtually eliminating direct current flow through the input transistor(s) of an input buffer circuit for an electret microphone is disclosed. An input transistor is provided and operably connected to an input and an output of the input buffer circuit. The input transistor has a first operating state wherein current flow occurs in a first direction and a second operating state wherein the a current flow occurs in a second direction—opposite that of the first direction. The input transistor is biased to alternately control operation between the first operating state and the second operating state. The alternating, opposing flows of current of the respective operating states cooperate to substantially reduce and virtually eliminate the flow of direct current through the input transistor(s) of the buffer circuit. A reduction in excess noise associated with the input transistor results from the substantially decreased direct current flow through the input transistor(s) of the buffer circuit.

23 Claims, 3 Drawing Sheets

SWITCHED MICROPHONE BUFFER

CROSS-REFERENCE TO RELATED APPLICATIONS

This application claims the benefit of U.S. Provisional Patent Application Serial. No. 60/372,451, entitled "Switched Microphone Buffer," filed Apr. 15, 2002. This application is incorporated herein by reference.

FEDERALLY SPONSORED RESEARCH OR DEVELOPMENT

Not Applicable.

TECHNICAL FIELD

This invention relates to input buffer circuits for a microphone. More specifically, the present invention is directed to a method and apparatus for reducing and/or eliminating excess noise in an electret microphone buffer circuit.

BACKGROUND OF THE INVENTION

Assisted-listening systems and/or devices, e.g., hearing aids, may utilize an electret microphone for converting sound energy to an electrical signal, signal processing circuitry for processing the electrical signal, and a receiver for converting the electrical signal to acoustical energy. Typically, the signal processing circuitry includes input buffer circuitry having an input impedance to match the output impedance of the electret microphone. The input buffer circuitry often includes a MOS transistor that is subject to undesirable 1/f noise, also called excess noise, or flicker noise.

The present invention is directed to solve these and other problems.

SUMMARY OF THE INVENTION

One embodiment of the present invention is directed to a method for reducing direct current flow through the input transistor of an input buffer circuit for an electret microphone. An input transistor is provided and operably connected to an input and an output of the input buffer circuit. The input transistor has a first operating state wherein a direct current flow occurs in a first direction and a second operating state wherein the direct current flow occurs in a second direction—the direct current flow in the first direction being opposite to the direct current flow in the second direction. The input transistor is biased to alternately control operation between the first operating state and the second operating state. The alternating and opposing flows of current during the respective operating states cooperate to substantially reduce and virtually eliminate the flow of direct current through the input transistor of the buffer circuit.

Another aspect of the present invention is directed to an input buffer circuit for an electret microphone. The circuit comprises an input transistor operably connected to an input of the circuit. A first switching control signal and a first set of switches cooperate to control the input transistor. The first set of switches comprises a first, second, and third switch. Each switch of the first set of switches has an "on" state and an "off" state. Each switch of the first set of switches is responsive to the first switching control signal. Also, a second switching control signal and a second set of switches cooperate to control the input transistor. The second set of switches comprises a first, second, and third switch. Each switch of the second set of switches has an "on" state and an "off" state responsive to the second switching signal. The first and second sets of switches compose a complementary set of switches wherein the "on" state of the first set of switches does not overlap with the "on" state of the second set of switches. Further included in the buffer circuit is a first resistor and a second resistor. The first resistor is operably connected to the input transistor, the first switch of the second set of switches, and the second and third switches of the first set of switches. The second resistor is operably connected to the input transistor, the first switch of the first set of switches, and the second and third switches of the second set of switches. An output of the input buffer circuit is operably connected to the input transistor and the third switch of both the first set and second set of switches. The output is operably responsive to the input transistor and the complementary set of switches wherein the mutually exclusive non-overlapping "on" states of the complementary set of switches alternately change the direction of current flow through the input transistor.

Another aspect of the present invention is directed to an input buffer circuit for a microphone. The input buffer circuit includes an input and an output. A first buffer having an "on" and "off" state is operably connected and responsive to a first set of switches. A second buffer having an "on" and "off" state is operably connected and responsive to a second set of switches. The first and second buffer compose a complementary set of buffers wherein the first and second buffers are controlled by their respective set of switches to ensure that either the first buffer or the second buffer is "on." The output of the input buffer circuit is operably connected to the first and second buffers wherein the mutually exclusive non-overlapping "on" states of the complementary set of buffers substantially reduce the flow of direct current through the input transistors of the input buffer circuit.

One object of the present invention is to provide a method for substantially reducing or virtually eliminating the occurrence of 1/f noise in an input buffer circuit for a microphone.

Another object of the present invention is to provide an input buffer circuit for an electret microphone wherein the flow of direct current through the input transistor of the input buffer circuit is substantially reduced or virtually eliminated.

These and other aspects and attributes of the present invention will be discussed with reference to the following drawings and accompanying specification.

DETAILED DESCRIPTION OF THE INVENTION

Figure 1:
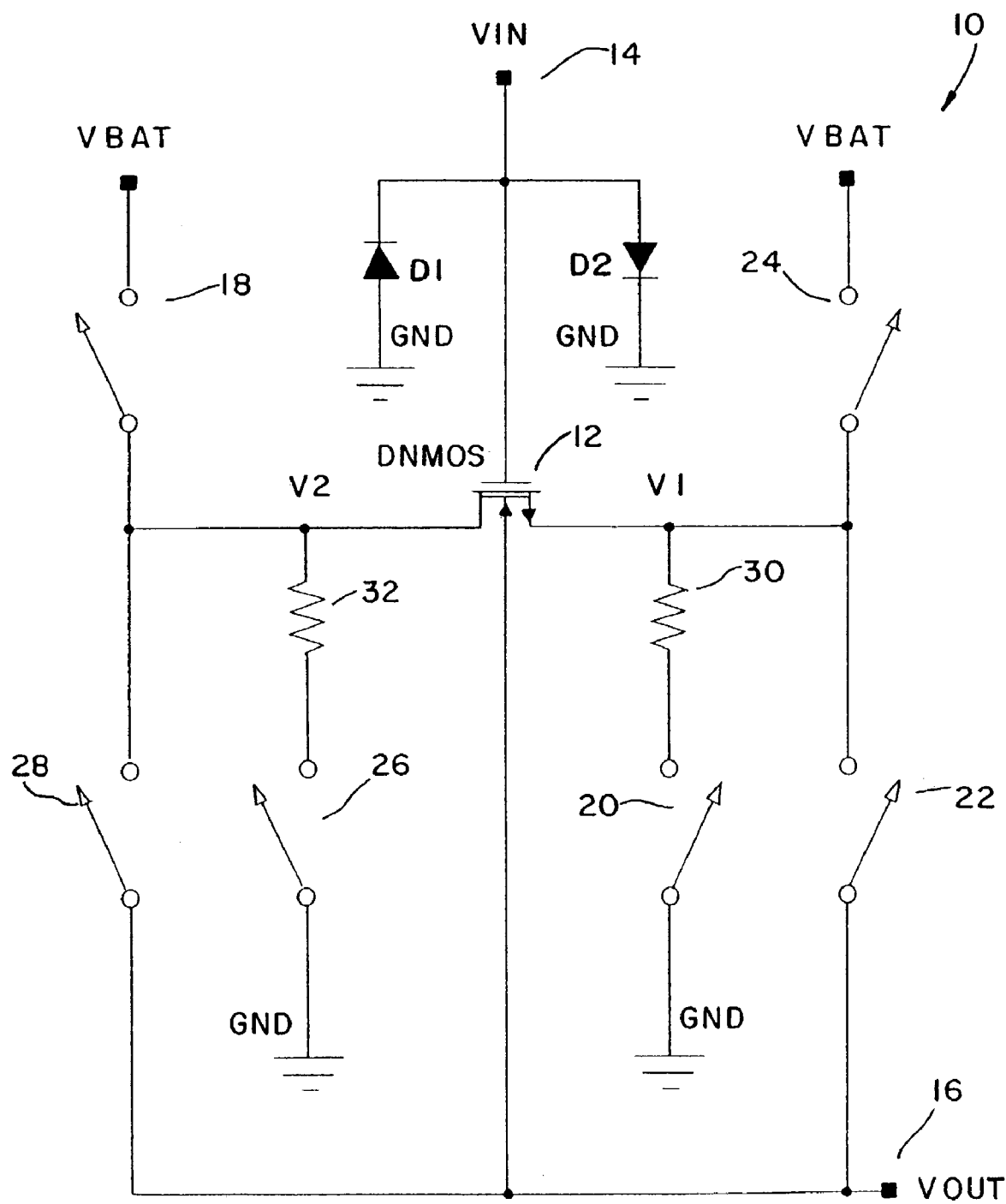
FIG. 1 shows one embodiment of present invention.

While this invention is susceptible of embodiment in many different forms, there is shown in the drawings, and will be described herein in detail, a specific embodiment thereof with the understanding that the present disclosure is to be considered as an exemplification of the principles of the invention and is not intended to limit the invention to the specific embodiments illustrated.

In typical electret microphone buffers, the 1/f noise of the input MOS transistor dominates the overall noise performance of the electronics. Typically this excess noise increases the total A-weight integrated noise of the buffer circuitry by 8–12 dB over that of the thermal noise contribution alone. Many methods have been devised to minimize the 1/f noise contribution in the overall system noise performance, such as correlated double sampling, chopper stabilization, etc., but none have addressed the fundamental source of the 1/f noise itself.

Although the physical cause of excess noise in MOS transistors is known to be due to the trapping and release of charge by the dangling bonds that reside at the Si—SiO$_2$ interface, it has also been verified that charge is trapped and excess noise is generated only when direct current (DC) flows through the device. (See Grey & Meyer, "Analysis and Design of Analog Integrated Circuits," $3^{rd}$ Edition, section 11.2.3.) According to the present invention, the microphone buffer includes circuitry to substantially reduce the flow of direct current through the noise sensitive input transistor.

A method for substantially reducing and virtually eliminating direct current flow through the input transistor of an input buffer circuit 10 for a microphone (not shown) comprises providing an input transistor 12 operably connected to an input 14 and an output 16 of the input buffer circuit 10. The input transistor 12 has a first operating state having a direct current flow in a first direction and a second operating state having a direct current flow in a second direction. The direct current flow in the first direction is opposite to the direct current flow in the second direction. The input transistor 12 is biased to alternately operate between the first operating state and the second operating state wherein the opposing flow of direct current of the respective operating states cooperates to reduce the flow of direct current through the input buffer circuit 10.

A first embodiment of the present invention is shown in FIG. 1. The input buffer circuit 10 for a microphone comprises the input 14 and the output 16. The input transistor 12 is operably connected to the input 14. A first set of switches comprises a first switch 18, a second switch 20, and a third switch 22. Each switch 18, 20, 22 of the first set of switches has an "on" state and an "off" state. Each switch 18, 20, 22 of the first set of switches is operably responsive to a first switching control signal. A second set of switches comprises a first switch 24, a second switch 26, and a third switch 28. Each switch 24, 26, 28 of the second set of switches has an "on" state and an "off" state. Each switch 24, 26, 28 of the second set of switches is operably responsive to a second switching control signal.

A first resistor 30 and a second resistor 32 are operably connected to the input transistor 12. The first resistor 30 is connected to the first switch 24 of the second set of switches, and to the second switch 20 and third switch 22 of the first set of switches. The second resistor 32 is connected to the first switch 18 of the first set of switches, and to the second switch 26 and third switch 28 of the second set of switches.

The output 16 of the input buffer circuit 10 is operably connected to the input transistor 12 and the third switches 22, 28 of the first set and second set of switches.

The first 18, 20, 22 and second 24, 26, 28 sets of switches compose a complementary set of switches wherein the "on" state of the first set of switches does not overlap with the "on" state of the second set of switches. The complementary set of switches having non-overlapping "on" states alternately change the direction of the current flow through the buffer input transistor 12.

The output 16 is operably responsive to the input transistor 12 and the complementary set of switches wherein the mutually exclusive non-overlapping "on" states of the complementary set of switches substantially reduce or virtually eliminate the DC current flow through the input transistor 12.

Preferably, the switches utilized in the first and second sets of switches are MOS transistors. Also, the input transistor 12 is preferably a depletion NMOS type, DNMOS. Although the two switches 20, 26 that alternately connect the first 30 and second 32 resistors to ground will have a non-zero average, i.e., DC, current flow through them—the MOS transistors that form these switches 20, 26—can be sufficiently large in area to essentially eliminate any significant 1/f noise that they may contribute.

DC current flow to any subsequent circuitry connected to the output terminal 16 must be avoided. One technique that can be utilized to inhibit such DC current flow is to operably connect an AC coupling capacitor (not shown) to the output 16 of the input buffer circuit 10. Thus, the two switches 22, 28 connected to the output 16 of the input buffer circuit 10 from nodes V1, V2 will not contribute significant 1/f noise.

Additionally, the two switches 24, 18, used to connect nodes V1 and V2 alternately to a battery terminal, VBAT, do not contribute significant 1/f noise to the buffer despite the fact that a non-zero average current will flow, since these particular switches 24, 18 merely act as cascoding devices for the respective drain terminals of the input transistor 12. Cascoding devices are known to be well suited for low noise applications.

Figure 2A:
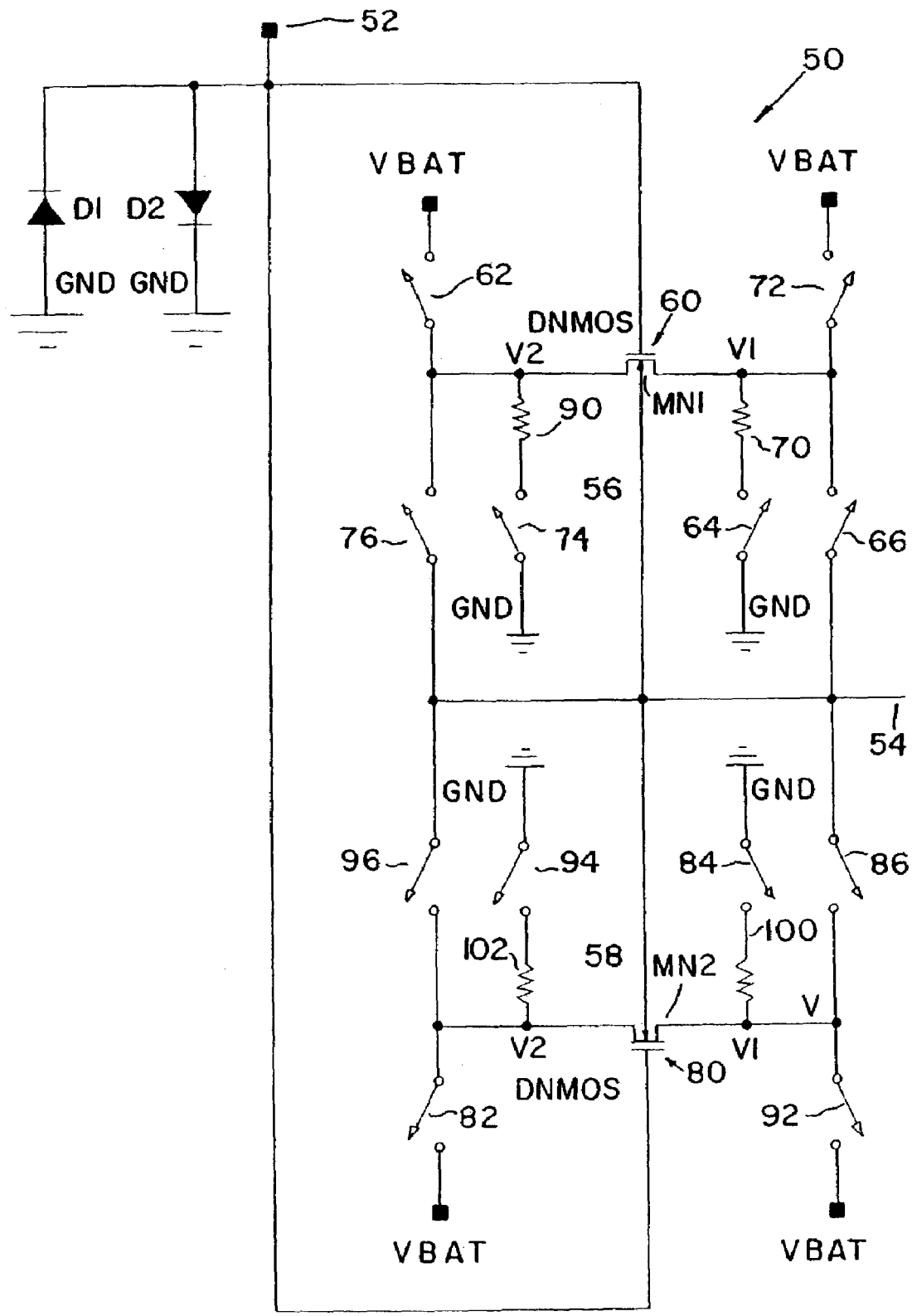
FIGS. 2a and 2b show an alternate embodiment of the present invention; and, FIGS. 3a and 3b show a graphic comparison of the output response characteristic of the circuits shown in FIGS. 1 and 2a, respectively.
Figure 2B:
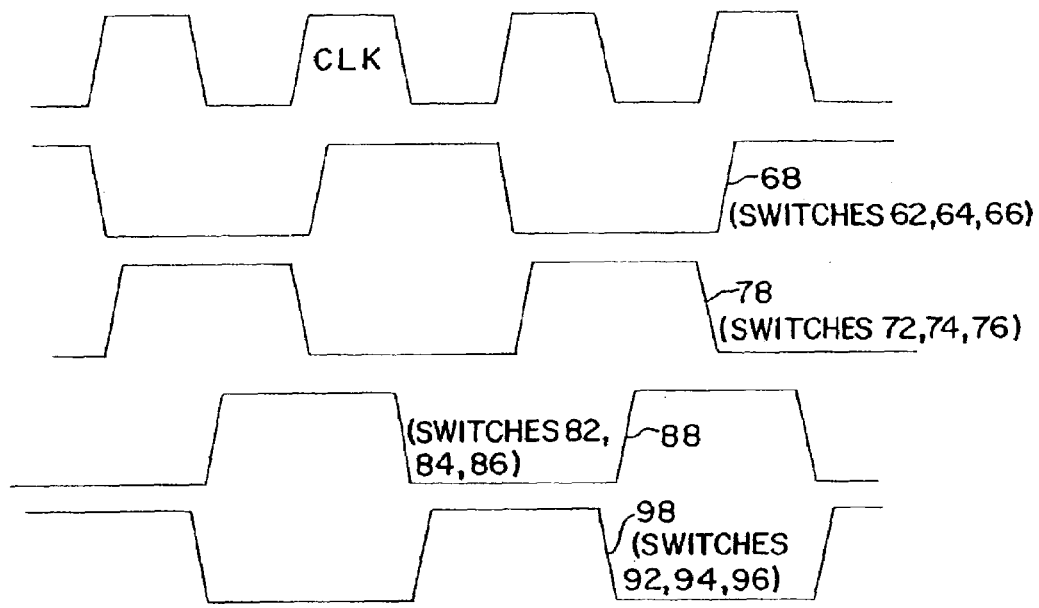

A second embodiment of the present invention is depicted in FIGS. 2a and 2b. An input buffer circuit 50 for a microphone (not shown) includes an input 52 and an output 54. A first buffer 56 is operably connected and responsive to a first complementary set of switches. A second buffer 58 is operably connected and responsive to a second complementary set of switches. The first and second buffers 56, 58 compose a complementary set of buffers wherein the first and second buffers are controlled by their respective set of switches to ensure that either the first buffer or the second buffer is operating in an "on" state. The output 54 is operably connected to the first buffer 56 and the second buffer 58 wherein the mutually exclusive non-overlapping "on" states of the complementary set of buffers reduce the flow of direct current through their input transistors 60, 80, respectively.

The first buffer 56 of the input buffer circuit 50 of FIG. 2a comprises a first transistor 60 operably connected to the input 52 and the output 54. The first set of switches includes a first switch 62, a second switch 64, and a third switch 66. Each switch 62, 64, 66 of the first set of switches has an "on" state and an "off" state and is operably responsive to a first switching control signal 68, see FIG. 2b.

The second set of switches of the first buffer 56 includes a first switch 72, a second switch 74, and a third switch 76. Each switch 72, 74, 76 of the second set of switches has an "on" state and an "off" state and is operably responsive to a second switching control signal 78, see FIG. 2b.

The first 62, 64, 66 and second 72, 74, 76 sets of switches compose the first complementary set of switches wherein the "on" state of the first set of switches does not overlap with the "on" state of the second set of switches. A first resistor 70 is operably connected to the first transistor 60, the first switch 72 of the second set of switches, the second switch 64 of the first set of switches, and third switch 66 of the first set of switches. A second resistor 90 is operably connected to the first transistor 60, the first switch 62 of the first set of switches, the second switch 74 of the second set of switches, and the third 76 switch of the second set of switches.

The second buffer 58 of the input buffer circuit 50 of FIG. 2a comprises a second transistor 80 operably connected to the input 52 and the output 54. A third set of switches includes a first 82 switch, a second switch 84, and a third switch 86. Each switch 82, 84, 86 of the third set of switches has an "on" state and an "off" state and is operably responsive to a third switching control signal 88, see FIG. 2b.

A fourth set of switches of the second buffer 58 includes a first switch 92, a second switch 94, and a third switch 96. Each switch 92, 94, 96 of the fourth set of switches has an "on" state and an "off" state and is operably responsive to a fourth switching signal 98, see FIG. 2b.

The third 82, 84, 86 and fourth 92, 94, 96 sets of switches compose a second complementary set of switches wherein the "on" state of the third set of switches does not overlap with the "on" state of the fourth set of switches. A third resistor 100 is operably connected to the second transistor 80, the first switch 92 of the fourth set of switches, the second switch 84 of the third set of switches, and third 86 switch of the third set of switches. A fourth resistor 102 is operably connected to the second transistor 80, the first switch 82 of the third set of switches, the second switch 94 of the fourth set of switches, and the third switch 96 of the fourth set of switches. The configuration shown in FIG. 2a, along with the control signals in FIG. 2b, ensures that either the first buffer 56 or second buffer 58 is operating at all times.

Figure 3A:
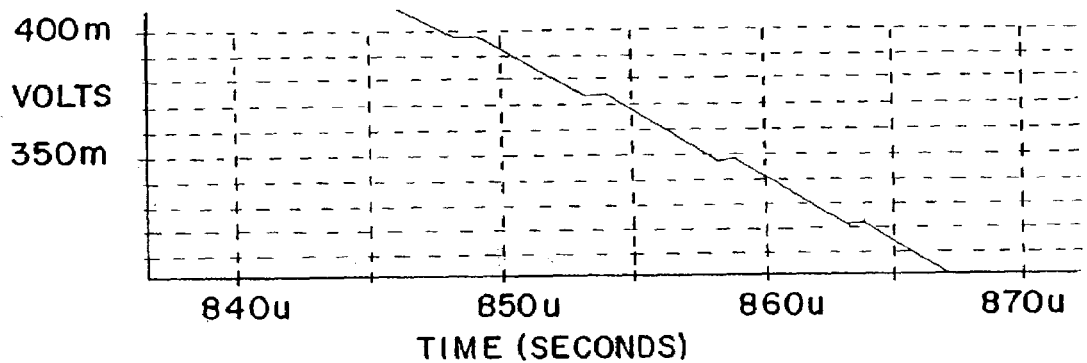
Figure 3B:
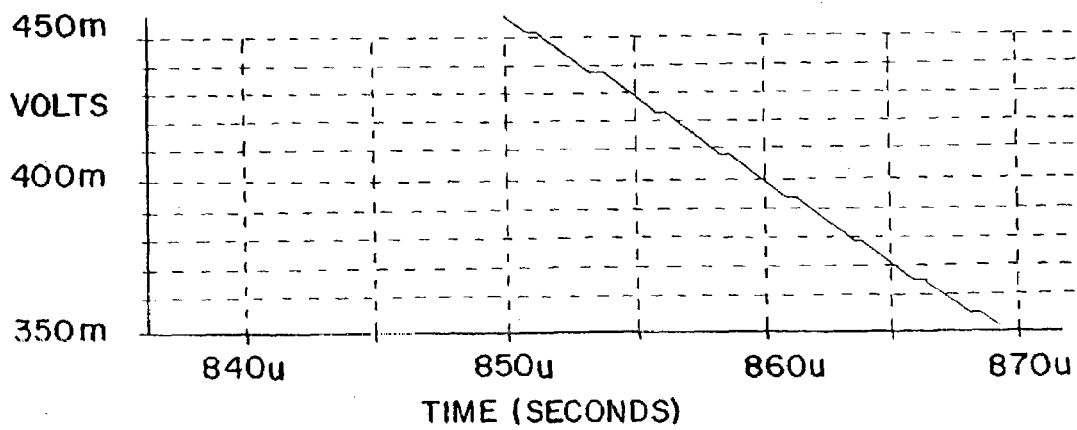

As is easily seen, the input buffer circuit 10 of FIG. 1 is nearly identical to the first buffer 56 circuitry of FIG. 2a. Due to the non-overlapping first switch control signal 68 and second switch control signal 78, the input buffer circuit 10 of FIG. 1 and the first buffer 56 circuitry of FIG. 2a will experience a brief time duration wherein the buffer circuit is completely shut off. This shut off period results in an undesirable "flat" characteristic in the buffer circuit's output response, see FIG. 3a. The addition of the second buffer 58 configured in FIG. 2a improves the output response characteristic of FIG. 1 by ensuring that at least one of the two buffers 56, 58 is always on. The dual buffer circuit substantially reduces and eliminates the "flat" output region that occurs with the single input buffer circuit 10 of FIG. 1, see FIG. 3b.

To achieve the same noise level between the dual switched buffer circuit 50 and the single switched buffer circuit 10, the physical characteristics of the input transistors 56, 58 and resistors 70, 90, 100, 102 of the dual switched buffer circuit 50 should be modified. Because both the first buffer 56 and the second buffer of the dual buffer circuit 50 are "on" simultaneously most of the time, the sizes of the resistors 70, 90, 100, 102 and input transistors, 60, 80 should be modified. Preferably, the size of the two depletion NMOS transistors 60, 80 is approximately half the size of the single input transistor 12; and the value of the resistors 70, 90, 100, 102 are approximately twice the value of the resistors 30, 32 of the input buffer circuit 10 in FIG. 1. These adjusted values for the dual buffer circuit 50 of FIG. 2a allow for the situation where both buffers 56, 58 are "on"—the combination of the widths, W, of the first transistor 60, the second transistor 80, and the (parallel) resistors 70, 90, 100, 102 results in the approximately equivalent dimensions of the input transistor 12, the first resistor 30, and the second resistor 32 of the input buffer circuit 10 shown in circuit of FIG. 1.

FIG. 2b depicts the timing diagram of the switching control signals 68, 78, 88, 98 required to operate the first buffer 56 and the second buffer 58 of the buffer circuit 50 of FIG. 2a 90° out of phase with each other, in order to eliminate the "flat" output characteristic of the single buffer implementation.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed is:

1. An input buffer circuit for a microphone, the circuit comprising:
    an input;
    an input transistor operably connected to the input;
    a first switching signal;
    a second switching signal;
    a first set of switches comprising a first, second, and third switch, each switch of the first set of switches having an "on" state and an "off" state, each switch of the first set of switches being responsive to the first switching signal;
    a second set of switches comprising a first, second, and third switch; each switch of the second set of switches having an "on" state and an "off" state, each switch of the second set of switches being responsive to the second switching signal,
    the first and second sets of switches composing a complementary set of switches wherein the "on" state of the first set of switches does not overlap with the "on" state of the second set of switches;
    a first resistor operably connected to the input transistor, the first switch of the second set of switches, and the second and third switches of the first set of switches;
    a second resistor operably connected to the input transistor, the first switch of the first set of switches, and the second and third switches of the second set of switches; and,
    an output being operably connected to the input transistor and the third switch of both the first set and second set of switches, the output being operably responsive to the input transistor and the complementary set of switches wherein the mutually exclusive non-overlapping "on" states of the complementary set of switches alternately change the direction of current flow through the input transistor.

2. The input buffer circuit of claim 1 further comprising a capacitor operably coupled to the output wherein DC current is prevented from flowing from the output.

3. The input buffer circuit of claim 1 wherein the first set of switches comprises a MOS transistor.

4. The input buffer circuit of claim 1 wherein the second set of switches comprises a MOS transistor.

5. The input buffer of claim 1 wherein the input transistor is a DNMOS type.

6. An input buffer circuit for a microphone, the circuit comprising:
    an input;
    a first set of switches;
    a first buffer being operably responsive to the first set of switches;
    a second set of switches;
    a second buffer being operably responsive to the second set of switches,
    the first and second buffer composing a complementary set of buffers wherein the first and second buffers are controlled by their respective set of switches to ensure that either the first buffer or the second buffer is "on;" and, an output being operably connected to the first and second buffers wherein the mutually exclusive non-overlapping "on" states of the complementary set of buffers substantially reduces and virtually eliminates the flow of direct current through the input transistors in each buffer circuit.

7. The input buffer circuit of claim 6 wherein the first buffer comprises:
   a first transistor operably connected to the input and the output;
   a first switching signal;
   a second switching signal;
   a first set of switches comprising a first, second, and third switch, each switch of the first set of switches having an "on" state and an "off" state, each switch of the first set of switches being responsive to the first switching signal;
   a second set of switches comprising a first, second, and third switch, each switch of the second set of switches having an "on" state and an "off" state, each switch of the second set of switches being responsive to the second switching signal,
   the first and second sets of switches composing a first complementary set of switches wherein the "on" state of the first set of switches does not overlap with the "on" state of the second set of switches;
   a first resistor operably connected to the first transistor, the first switch of the second set of switches, and the second and third switches of the first set of switches; and,
   a second resistor operably connected to the first transistor, the first switch of the first set of switches, and the second and third switches of the second set of switches.

8. The input buffer circuit of claim 6 wherein the second buffer comprises:
   a second transistor operably connected to the input, the output, and the first transistor;
   a third switching signal;
   a fourth switching signal, the third and fourth switching signals being 180° out of phase with the first and second switching signals, respectively;
   a third set of switches comprising a first, second, and third switch, each switch of the third set of switches having an "on" state and an "off" state, each switch of the third set of switches being responsive to the third switching signal;
   a fourth set of switches comprising a first, second, and third switch; each switch of the fourth set of switches having an "on" state and an "off" state, each switch of the fourth set of switches being responsive to the fourth switching signal,
   the third and fourth sets of switches composing a second complementary set of switches wherein the "on" state of the third set of switches does not overlap with the "on" state of the fourth set of switches;
   a third resistor operably connected to the second transistor, the third switch of the fourth set of switches, and the second and third switches of the third set of switches; and,
   a fourth resistor operably connected to the second transistor, the third switch of the third set of switches, and the second and third switches of the fourth set of switches, wherein either the first or second buffer is ensured to be operating at all times.

9. The input buffer circuit of claim 6 further comprising a capacitor operably coupled to the output wherein DC current is prevented from flowing from the output.

10. The input buffer of claim 7 wherein each of the first, second, third, and fourth sets of switches comprise a MOS transistor.

11. The input buffer of claim 8 wherein each of the first, second, third, and fourth sets of switches comprise a MOS transistor.

12. The input buffer of claim 7 wherein the first transistor comprises a DNMOS type transistor.

13. The input buffer of claim 8 wherein the second transistor comprises a DNMOS type transistor.

14. An input buffer circuit for a microphone, the circuit comprising:
    an input;
    a first buffer having an "on" and an "off" operating state;
    a second buffer having an "on" and an "off" operating state;
    a means for controlling the respective operating state of the first buffer and the second buffer; and,
    an output being operably connected to the first buffer and the second buffer wherein the means for controlling cooperates with the first buffer and the second buffer to substantially reduce and virtually eliminate the flow of direct current through the input transistors of each buffer circuit.

15. The input buffer circuit of claim 14 wherein each buffer comprises an input transistor.

16. The input buffer circuit of claim 15 wherein each input transistor is a DNMOS type.

17. The input buffer circuit of claim 14 further comprising:
    a capacitor operably coupled to the output wherein DC current is prevented from flowing from the output.

18. A method for substantially reducing and virtually eliminating direct current flow through the input transistor of an input buffer circuit for an electret microphone, the method comprising the steps of:
    providing an input transistor, the input transistor being operably connected to an input and output of the input buffer circuit, the input transistor having a first operating state having a current flow in a first direction and a second operating state having a current flow in a second direction, the current flow in the first direction being opposite to the current flow in the second direction; and,
    biasing the input transistor to alternately operate between the first operating state and the second operating state wherein the opposing flow of current of the respective operating states cooperates to substantially reduce and virtually eliminate the flow of direct current through the input transistor of the buffer circuit.

19. The method of claim 18 wherein the biasing the input transistor comprises the steps of:
    providing a switching control signal;
    providing a first set of switches comprising a first, second, and third switch, each switch of the first set of switches having an "on" state and an "off" state, each switch of the first set of switches being responsive to the switching control signal;
    providing a second set of switches comprising a first, second, and third switch; each switch of the second set of switches having an "on" state and an "off" state, each switch of the second set of switches being responsive to the switching control signal;
    receiving the switching control signal; and, alternating the operating state of first and second sets of switches wherein the "on" state of the first set of switches does not overlap with the "on" state of the second set of switches.

20. The method of claim 18 further comprising the step of:

eliminating direct current flow from the input buffer circuit output terminal.

21. The method of claim 19 further comprising the step of:

eliminating direct current flow from the input buffer circuit output terminal.

22. The method of claim 20 wherein eliminating direct current flow from the input buffer circuit output terminal comprises the step of:

connecting a capacitor in series with the output of the input buffer circuit.

23. The method of claim 21 wherein eliminating direct current flow from the input buffer circuit output terminal comprises the step of:

connecting a capacitor in series with the output of the input buffer circuit.

* * * * *